United States Patent [19]
Seroussi et al.

[11] Patent Number: 5,488,365
[45] Date of Patent: Jan. 30, 1996

[54] METHOD AND APPARATUS FOR COMPRESSING AND DECOMPRESSING SHORT BLOCKS OF DATA

[75] Inventors: Gadiel Seroussi, Cupertino, Calif.; Abraham Lempel, Haifa, Israel

[73] Assignee: Hewlett-Packard Company, Palo Alto, Calif.

[21] Appl. No.: 204,712

[22] Filed: Mar. 1, 1994

[51] Int. Cl.⁶ .................................................. H03M 7/30
[52] U.S. Cl. .............................................. 341/51; 341/106
[58] Field of Search ............................... 341/50, 51, 106

[56] References Cited

U.S. PATENT DOCUMENTS

| | | | |
|---|---|---|---|
| 4,079,458 | 3/1978 | Rider et al. | 364/900 |
| 4,152,697 | 5/1979 | Rider et al. | 341/63 |
| 5,123,061 | 6/1992 | Pritchard | 382/56 |
| 5,150,430 | 9/1992 | Chu | 382/56 |
| 5,245,614 | 9/1993 | Gutman et al. | 370/118 |
| 5,298,895 | 3/1994 | Van Maren | 341/51 |
| 5,396,595 | 3/1995 | Standley | 395/250 |

OTHER PUBLICATIONS

J. Rissanen, Universal coding, information, prediction, and estimation, IEEE Transaction on Information Theory (Jul. 1984).

J. Rissanen, G. G. Langdon, Universal modeling and coding, IEEE Transaction on Information Theory (Jan. 1981).

J. Rissanen, A universal state compression system, IEEE Transaction on Information Theory (Sep. 1983).

J. Ziv, A. Lempel, A universal algorithm for sequential data compression, IEEE Transactions On Information Theory (May 1977).

J. Ziv, A. Lempel, Compression of Individual Sequences Via Variable-Rate Coding, IEEE Transactions on Information Theory, Sep. 1978.

T. Bell, A Unifying Theory and Improvements for Existing Approaches to Text Compression, University of Canterbury, 1986.

Primary Examiner—Marc S. Hoff

[57] ABSTRACT

A scheme for compression of large sets of short blocks of data for storage in a storage medium, such as a read-only memory. Applications of the scheme include compression of fonts for printers, ROM disks in portable PCs, and others. These applications require random access to individual blocks, and fast, real-time decompression. The scheme applies an asymmetrical three-stage methodology in which a first stage provides training and optimization for a set of data blocks; a second stage effects data compression; and a third stage effects data decompression.

20 Claims, 5 Drawing Sheets

METHOD AND APPARATUS FOR COMPRESSING AND DECOMPRESSING SHORT BLOCKS OF DATA

BACKGROUND OF THE INVENTION

1. Technical Field

The present invention relates to data compression. More particularly, the present invention relates to compressing large sets of short blocks of data.

2. Description of the Prior Art

Read-only memory ("ROM") is used in many of today's electronic products to store the firmware and data that define the product functionality. In some instances, the amount of available physical ROM is dictated by hardware design or cost considerations, and the amount of data that can be stored in the ROM determines the level of functionality of the product. Conversely, in other instances, a minimal functionality is required, and the amount of physical ROM required to accommodate such functionality impacts the hardware requirements, and, ultimately, the cost of the product. In either case, the use of data compression to store more data in the same amount of physical ROM can lead to competitive advantages in functionality, cost, or both.

For example, built-in ROM is used to store large data sets in printers manufactured for the Asian market. To meet minimal functionality requirements, these printers must include a certain number of Kanji fonts in some industry standard format (e.g. TrueType® format). A typical Kanji font includes representations of about 10,000 Kanji glyphs. Each glyph varies in length from a few tens to several hundreds of bytes each. The total size of the uncompressed font is typically between 2 and 3 Mbytes. When printing a page, the printer must be able to access each of the individual glyphs in a random fashion and in real time. Therefore, if compression is used, each glyph must be compressed independently, or in small groups, such that when a given glyph is accessed, only a small amount of data needs to be decompressed.

The requirement that small blocks of data be compressed independently to allow independent and random access to each compressed block makes it difficult to exploit redundancies and correlation between the different blocks as part of a compression scheme. Another critical parameter is decompression speed, dictated by the real-time access requirement. Clearly, decompression speed and block size are related. A faster decompression algorithm allows larger groups of glyphs to be compressed together, thereby providing better compression ratios while still meeting the real-time decompression requirement. In the printer application discussed above, a certain minimal number of fonts must be stored in ROM to meet minimal functionality requirements. Data compression can help reduce the physical hardware size (e.g. number or size of ROM integrated circuits) required to store this minimal font set, thus reducing the cost of the product.

Another example of a ROM-based data compression application is the use of a ROM disk in super-portable computers. These computers may include the operating system and several popular software applications in a ROM card that is built into the machine. The amount of software that can be built into the product, and, hence, its functionality, are limited by the physical size of the ROM card. For a given physical size, the increased logical capacity of the ROM card that results from data compression leads to increased product functionality, and, hence, increased product marketability.

The ROM card is logically organized, and is seen by the system as a regular disk containing a file system. The minimal unit of data that is accessed by the system is a disk cluster, i.e. a data block whose size can vary between about 512 and 8192 bytes. Generally, the disk cluster size is fixed for a given file system. A typical ROM disk has a total capacity of about 10–20 Mbytes (i.e. raw, uncompressed capacity). As in the case of the printer font application discussed above, a ROM disk application requires that thousands of small blocks of data, i.e. the disk clusters, must be randomly accessible in real time.

These are just two examples of a class of applications of data compression that share the following set of common requirements:

1. The data set consists of a multitude, e.g. thousands, of short blocks of data, e.g. data blocks having from a few tens to a few thousand bytes.

2. The individual data blocks must be randomly accessible. Therefore, it must be possible to decompress each block independently.

3. Access time to individual blocks is critical. Therefore, decompression time is critical. However, compression is not time critical because it only need be performed once.

The state of the art provides several symmetrical data compression/decompression schemes. A thorough compression, i.e. one that achieves the densest possible compression, takes longer. Thus, there may not be sufficient time available in a symmetric, real time system, for a thorough compression cycle. In an asymmetric system, i.e. one that does not impose real time restrictions on the compression phase, a more thorough compression can be obtained. On the other hand, during the compression cycle, data structures can be optimized to accelerate the decompression cycle.

A scheme for compressing large data sets consisting of several small blocks of data would find ready application in the data processing industry and allow manufacturers to increase product functionality and decrease product form factor.

SUMMARY OF THE INVENTION

The invention herein provides a scheme for compression of large sets of short blocks of data for storage in a storage medium, such as a read-only memory. Applications of the scheme include compression of fonts for printers, ROM disks in portable computers, and others. Such applications require random access to individual blocks, and fast (i.e. real-time or near real-time) decompression. In such applications, compression may be performed off-line, and is not time-critical. The scheme herein provides asymmetrical data compression/decompression, and thereby achieves both maximum data density and minimum data access time. The invention produces good compression ratios that lead to decreased hardware requirements and increased functionality for various products.

The scheme consists of three distinct stages. The first stage involves reading and processing the data blocks, gathering statistics, and generating intermediate data and optimized tables that are used during compression/decompression.

The second stage involves compression of the individual blocks and building a compressed file that includes index tables which allow access to individual blocks, and tables used in the decompression process. Both the first and second stages are run off-line, and not necessarily on the machine that eventually makes use of the compressed data. Both stages may therefore proceed at a pace that assures maximum data compression.

The third and final stage of the scheme involves decompression. This stage runs on the target machine, in real time, and uses the index and decompression tables in the stored compressed file to access and decompress individual blocks on demand, as required by the application.

DETAILED DESCRIPTION OF THE INVENTION

Figure 1:
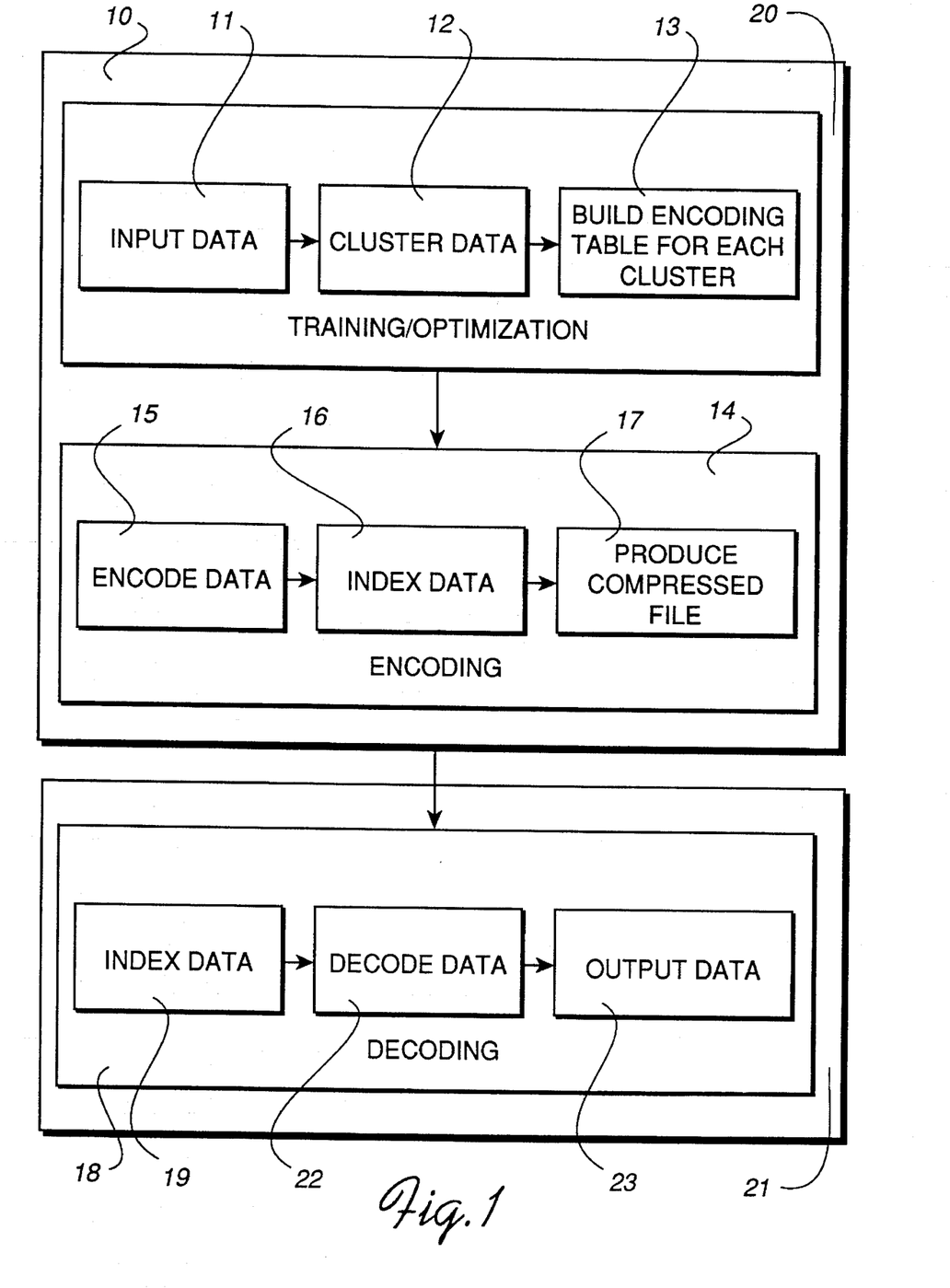
FIG. 1 is a flow diagram showing a scheme for compressing and decompressing large sets of small blocks of data according to the invention.

The invention provides a data compression/decompression scheme for large sets of short data blocks, as shown in the flow diagram of FIG. 1. The scheme consists of three distinct stages:

1. Training and optimization (10). This stage includes reading and processing the data blocks, gathering statistics, and generating intermediate data and optimized tables that are used during compression/decompression. This stage may take as long as necessary to assure maximum data compression and therefore can be very computationally intensive.

2. Compression (14). This stage includes compression of the individual blocks and building a compressed file having index tables that allow access to the individual blocks and tables used during the decompression process. This stage is also computationally intensive, although usually less so than the first stage. Both stages are run off-line, and not necessarily on the machine that eventually makes use of the compressed data.

3. Decompression (18). This stage runs in real time on the target machine, and uses the index and decompression tables in the stored compressed file to access and decompress individual blocks, as required by the application.

The three stages are now described in more detail.
Training and optimization (10)

In this stage, each data block is processed independently (11), and parsed using the LZ1 variant of the Lempel-Ziv data compression algorithm. See, for example J. Ziv, A. Lempel, A universal algorithm for sequential data compression, IEEE Transactions On Information Theory (May 1977). In principle, other variants, e.g. LZ2 (see J. Ziv, A. Lempel, Compression of Individual Sequences Via Variable-Rate Coding, IEEE Transactions on Information Theory, September 1978; and T. Bell, A Unifying Theory and Improvements for Existing Approaches to Text Compression, University of Canterbury, 1986), or even non-LZ schemes, could be used as well. However, the LZ1 variant is preferred in the exemplary embodiment of the invention for shod: blocks of data, since its main relative disadvantage, slow compression speed, is irrelevant in this application.

Figure 2:
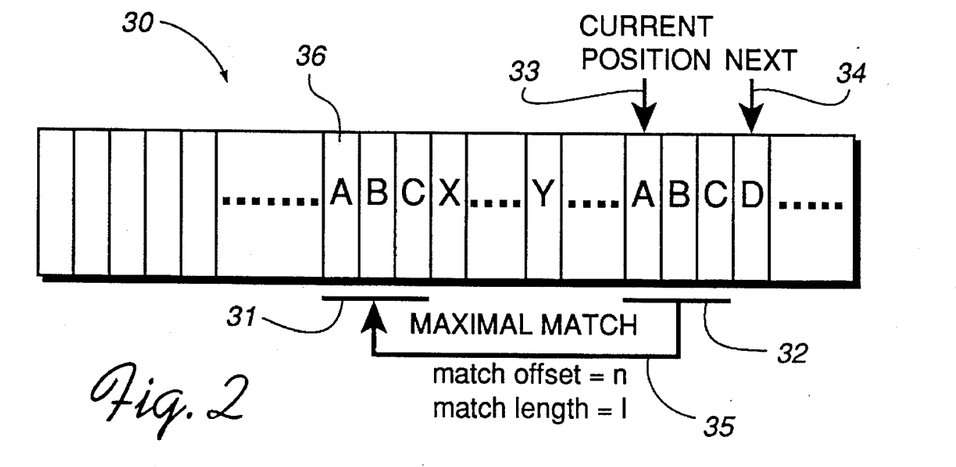
FIG. 2 is an example of string matching using a Lempel-Ziv data compression algorithm.

FIG. 2 is an example of string matching using a Lempel-Ziv data compression algorithm. The basic principle of the LZ algorithm is to find the longest possible match of the current input to strings of bytes that have already occurred in previous parts of the data block. More specifically, the data block is parsed into a sequence of events. There are two types of events:

1. String matches. A string match is described by two integers: offset and length. The offset, which is measured in the number of bytes back from the current position in the input, points to the place in the past input buffer where the matched string occurs. The number of matched bytes is given by the length parameter. String match references are relative to the current data block, and no inter-block referencing is allowed.

In FIG. 2 this process is shown for a data string 30 that consists of several bytes, e.g. the byte 36 that contains the letter "A". A current position in the input is shown by numeric designator 33. A match offset points to the position 36 where a match is found. The process continue to look for matches until a maximal match is determined, i.e. the point at which a string match no longer occurs. In the example of FIG. 2, a current string "ABC" (32) is matched (35) to an existing string "ABC" (31). A next match (34) is then begun with the letter "D".

2. Literal bytes. This is one byte of the data, for example a byte that cannot be matched to previous input, that is transmitted literally, without reference to past data. In the example of FIG. 2, letter "D" (34) would constitute a literal byte.

The LZ1 parsing algorithm for a data block can be summarized as follows:

Input: A block b[0] b[1] b[2] . . . b[N] of bytes.

Output: A sequence of events.

Step 1: Set i←0.

Step 2: If i>N, stop.

Step 3: Find an index k<i and the corresponding integer $L_k \geq 0$, such that b[i] b[i+1] . . . b[i+$L_k$−1]=b[k] b[k+1] . . . b[k+$L_k$−1], and $L_k$ is as large as possible, i.e. the longest match.

Step 4: If $L_k$<$L_{min}$, then output the event "Literal b[i]", set i←i+1, and go to Step 2. Else, go to Step 5.

Step 5: Output a string match event (offset, length) with offset=i−k, length=$L_k$. Set i←i+$L_k$, and go to Step 2.

In the exemplary embodiment of the invention, the search for the longest match in Step 3 can be exhaustive, taking as much time as needed, because time complexity is not critical at this stage. The parameter $L_{min}$ in Step 4 can be set to 1, or a small threshold value specifying a minimal match length. Values of $L_{min}$ =2 or 3 are used in practice.

Reference should be had to FIG. 1 for the following discussion.

The sequence of events produced by the LZ1 parsing algorithm are eventually encoded to form the compressed data, but, at this point in the process, no encoding is done. Instead, statistics are gathered on the frequency of occurrence of events, and a histogram of these frequencies is built for each individual data block. Since the blocks are relatively short, these histograms are quite sparse.

The statistics gathered in the previous stage are used to design an optimal encoding of the events (13), using a statistics-based compression method, e.g. Huffman encoding. See, for example T. Cover, J. Thomas, *Elements of Information Theory*, Chapter 5, John Wiley & Sons, New York (1991). This encoding assigns shorter codes to more frequent events, and longer codes to less frequent ones. Ideally, the shortest possible encoding for a block is obtained by designing a code based solely on the statistics for that block. However, the encoding table, in some form (or equivalently, the histogram), must also be made available to the decompressor. The cost of storing a separate code table for each block would offset any compression that the encoding might obtain.

In the other extreme, one encoding table could be used for the whole set of data blocks. Such table would be obtained by joining the histograms for all the blocks into one global histogram, and deriving the table from that global histogram. Although this would minimize the space occupied by the tables, the encoding obtained is far from optimal for many data blocks.

An intermediate solution, which is applied in the invention, is to partition the set of blocks into clusters with similar statistics, join the histograms of the blocks belonging to each cluster into one histogram, and design optimal encoding/ decoding tables for each cluster, based on the joint histogram. These are not the disk clusters mentioned as an example above in connection with the discussion of the background of the invention, but rather are clusters of data blocks (in the disk example, these are clusters of disk clusters). This meaning of the word "cluster" is assumed throughout the remainder of the discussion herein.

Figure 3:
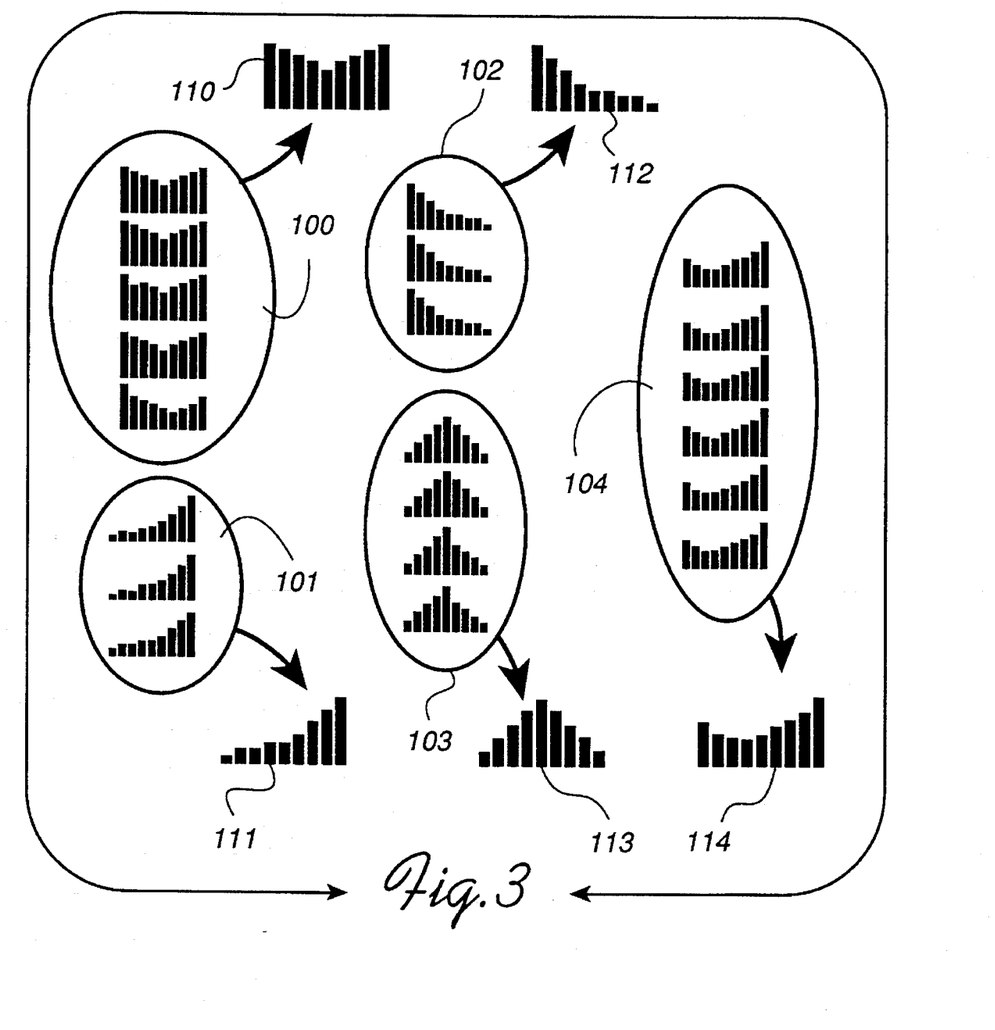
FIG. 3 is an example of histogram clustering according to the invention.

FIG. 3 is an example of histogram clustering according to the invention. In the figure, each data block is represented by its histogram (statistics), which is graphically depicted as a bar chart. Various data blocks are grouped (clustered) according to some common characteristic, e.g. statistical similarity, which is shown in the figure as similarity of the histogram shape. The groupings or clusters 100, 101, 102, 103, 104 are used to develop representative histograms 110, 111, 112, 113, 114. A representative histogram can be derived, for example, by summing all the histograms comprised by the cluster. Each representative histogram is used to develop an encoding table for all of the data blocks contained in the corresponding cluster. In this way, the number of decompression tables that must be stored together with the set of compressed data blocks is substantially reduced. The number of clusters, and the assignment of blocks to clusters are designed so that the sum $$S = S_T + S_E \quad (1)$$

is minimized, where $S_T$ denotes the size of the decoding tables that are stored together with the encoded data, and $S_E$ denotes the size of the encoded data itself. S denotes the total size of the compressed data.

Equation 1 represents the well known information theory paradigm that divides the data compression process into two parts: modeling and coding, each part having an associated cost. $S_T$ represents the model cost, i.e. the cost associated with describing a statistical model of the data; and $S_E$ represents the code cost, i.e. the cost of an optimal encoding of the data based on the model. See, for example J. Rissanen, Universal coding, information, prediction, and estimation, IEEE Transaction on Information Theory (July 1984); and J. Rissanen, G. G. Langdon, Universal modeling and coding, IEEE Transaction on Information Theory (January 1981).

Notice that the grouping of data blocks into clusters is not restricted by any natural ordering that the data blocks might have had, e.g. the order of the characters in a font, or the order of disk blocks in a ROM disk. The data blocks can be taken in any arbitrary order and, in principle, all possible permutations could be considered. Thus, for example, the first data block could be clustered together with the last data block. This is possible due to the asymmetry of the system. The number of passes through the data during the clustering process is not limited. This approach is in contrast to traditional symmetric compression systems, where data blocks must be processed in the natural sequential order.

Although absolute optimal clustering of histograms might be computationally unfeasible to achieve, practical approaches leading to good, albeit sub-optimal, compression ratios are possible. These approaches are based on prior knowledge of the data, or on heuristic clustering criteria, where the most appropriate solution of several found by alternative methods is selected at successive stages for use in the next step of the optimization. One exemplary heuristic sorts the data blocks by a compressibility index obtained from compressing each block using its own statistics, and then clusters blocks with similar compressibility indices. The following procedure is one implementation of this heuristic:

1. Determine the number of clusters N (e.g. try different values of N until the best compression is obtained. In practical applications, N is not a large number).

2. For each input data block, perform an LZ1 parsing operation, generate statistics for the events resulting form the parsing, generate an optimal encoding table based upon the statistics, and compute a compressibility index R of the block, which is equal to the compression ratio obtained when encoding the block using the optimal table.

3. Determine compression thresholds $T_1, T_2, \ldots, T_{n-1}$ (see below). Set $T_0 = 0$, $T_n = \infty$.

4. Define clusters $C_1, C_2, \ldots, C_n$ as follows:

$C_i = \{$all blocks with a compressibility index satisfying $T_{i-1} < R \leq T_i\}$ One way of defining the compression thresholds $T_i$ is to set them so that the resulting clusters $C_i$ are of approximately equal size. This heuristic is based upon the principle that blocks having similar statistical characteristics have similar compressibility indices (although the converse is not necessarily true).

In the case of a font application, an heuristic approach clusters glyphs with known morphological similarities, i.e. glyphs that contain similar shapes. In the case of the ROM disk application, an heuristic approach clusters data block that originate from computer files of the same type (e.g. executable files, text files, graphic files, etc.).

A more general approach to the data block clustering is based on vector quantization. See, for example A. Gersho, R. M. Gray, Vector Quantization and Signal Compression, Kluwer Academic Publishers, Boston (1992). Here, it is assumed that the number of clusters is known (one could later try different values of this number). In this approach, a vector quantization codebook design technique is used to define the histogram clusters. This approach requires a notion of distance between the vectors being quantized, which are in this case, the histograms. One factor that could be used to provide a value for this distance is the informational divergence between the distributions represented by the histograms, which can be used to measure the similarity between the statistical distributions. See, for example T. Cover, J. Thomas, Elements of Information Theory, John Wiley & Sons, Inc., New York (1991).

Yet another exemplary approach to histogram clustering is provided by universal modeling techniques, which provide a systematic way of joining statistics from different states into a minimal model of the data. See, for example J.

Rissanen, A universal state compression system, IEEE Transaction on Information Theory (September 1983); J. Rissanen, Universal coding, information, prediction, and estimation, IEEE Transactions on Information Theory (July 1984); and M. Weinberger, J. Rissanen, M. Feder, A universal finite memory source, IEEE Transactions on Information Theory (submitted 1993).

In practice, empirical data show that even simplistic approaches yield satisfactory compression results. For example, where the data blocks are divided into a number of equal subsets without paying much attention to the ordering, and just the number of subsets are optimized (such as the heuristic procedure described above, but without computing compressibility indices). Please refer to FIG. 1 for the following discussion.

Thus, at the end of the training and optimization stage (11), there is a partition of data blocks into clusters (12), and a set of encoding tables (13), one for each cluster. These encoding tables specify the translation of events into binary codes, and are optimized to obtain the shortest possible encoding for the cluster. The binary code for an event encodes both what type of event it is, i.e. literal or string match, and the value of the event itself, i.e. the literal byte, or the values offset and length.

Compression

In the compression stage (14), the LZ1 parsing of the data blocks is repeated (15), and the resulting events are encoded using the encoding tables generated in the training and optimization stage. These tables are included with the compressed data, in a form suitable for fast decompression. In the case of Huffman code tables, they are translated from their encoding form to a decoding form consisting of lookup tables for fast decompression. A resulting compressed file is thus produced (17).

Figure 4:
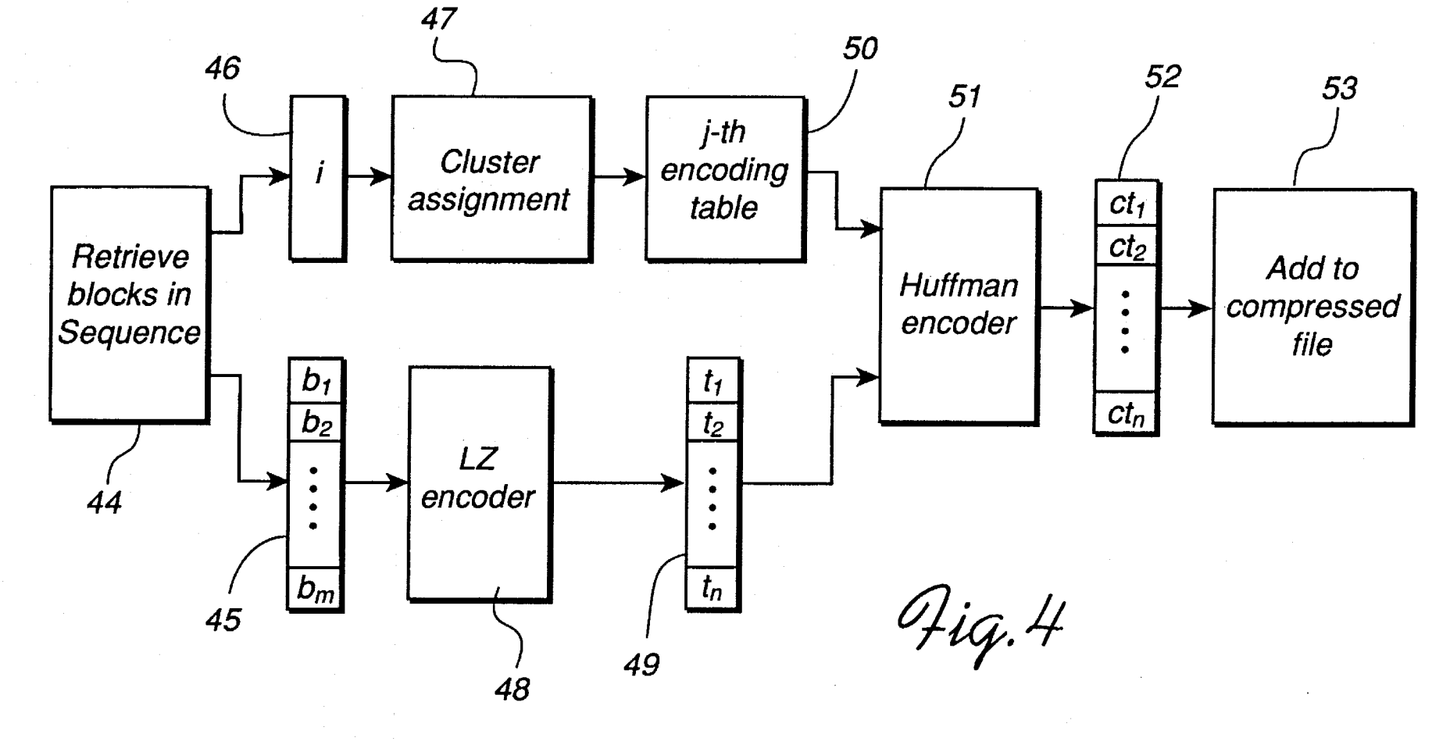
FIG. 4 is a block schematic diagram of a coder according to the invention.

FIG. 4 is a block schematic diagram of a coder according to the invention. In the figure, blocks of data 45 are retrieved in sequence 44, for example a block with index number i 46 is retrieved. Each block is assigned to a cluster 47 and an encoding table 50 is generated for each cluster. For example, block i 46 belongs to cluster j 50. Plain bytes of the data block 45 are encoded with an LZ-type encoder 48 to produce a parsed block 49 of plain tokens (events). The blocks 49 are encoded with a Huffman encoder 51 using the tables 50 and a compressed block 52 is generated, which is added to a compressed file 53.

Figure 5:
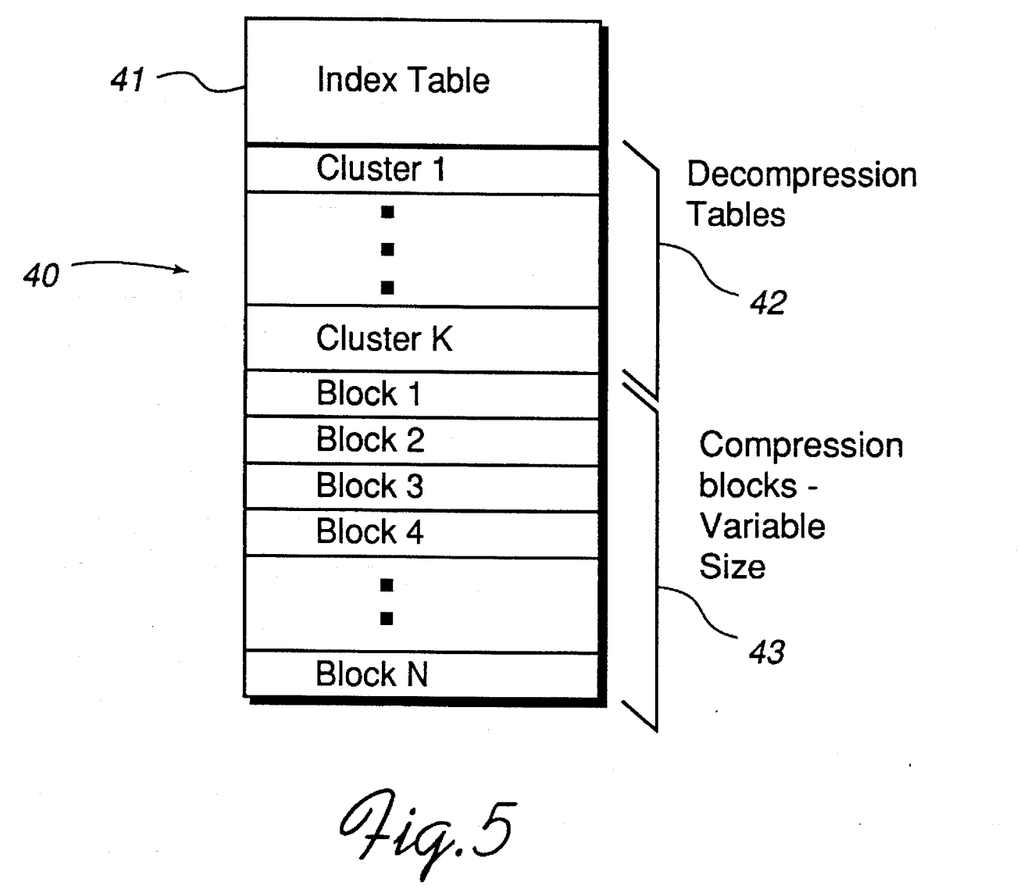
FIG. 5 is an example of a compressed file structure showing an index table containing one index record for each compressed data block according to the invention.

FIG. 5 is an example of a compressed file structure (40) showing an index table (41) containing one index record for each compressed data block according to the invention. An index record contains the following:

1. The address of the decompression table (42) associated with the cluster containing the block.
2. The address of the beginning of the compressed block (43).
3. Length of the compressed block (43). This field need not be present if compressed blocks are stored in index order.
4. Other application-dependent information on the block.

Decompression

Please refer to FIG. 1 for the following discussion.

The decompression process (18) is a straightforward inversion of the compression steps, and is summarized below.

Input: A block index k (numeric designator 19 in FIG. 1).

Output: A block b[0] b[1] b[2] ... b[N] of bytes.

Step 1: Access the kth entry in the index table to obtain a pointer to a decompression table, and a pointer to a compressed block. The compressed block has the form c[1] c[2] ... c[M], where the c[j] are encoded events.

Step 2: Set N←0, j←1.

Step 3: If j>M, go to Step 7.

Step 4: Use the decompression table to decode c[j] into an event description e[j] (numeric designator 22 in FIG. 1)

Step 5: If e[j] is a "Literal b", set b[N]←b, N←N+1, j←j+1, and go to Step 3. Else, go to Step 6.

Step 6: e[j] is a pair (match, offset). Set k←N− offset, L←length. Copy the string b[k] b[k+1] ... b[k+L−1] to b[N] b[N+1] ... b[N+L−1]. Set N←N+L, j←j+1, and go to Step 3.

Step 7: Output b[0] b[1] b[2] ... b[N] (numeric designator 23 in FIG. 1). Stop.

In FIG. 1 the training and optimization stage and compression stage are shown contained within a common boundary defined by numeric designator 20, while the decompression stage is shown contained within a separate boundary defined by numeric designator 21. It should be appreciated that the processes of compression and decompression are asymmetrical. That is, the compression process proceeds in such manner to assure maximum data compression and without concern to the actual amount of time necessary to effect such compression, while data decompression must proceed as quickly as possible. Thus, compression and decompression typically occur in different environments. In this way, the scheme disclosed herein provides maximum data compression while allowing fast, real-time access to short blocks of data contained in a large data set, such as in a Kanji font.

Figure 6:
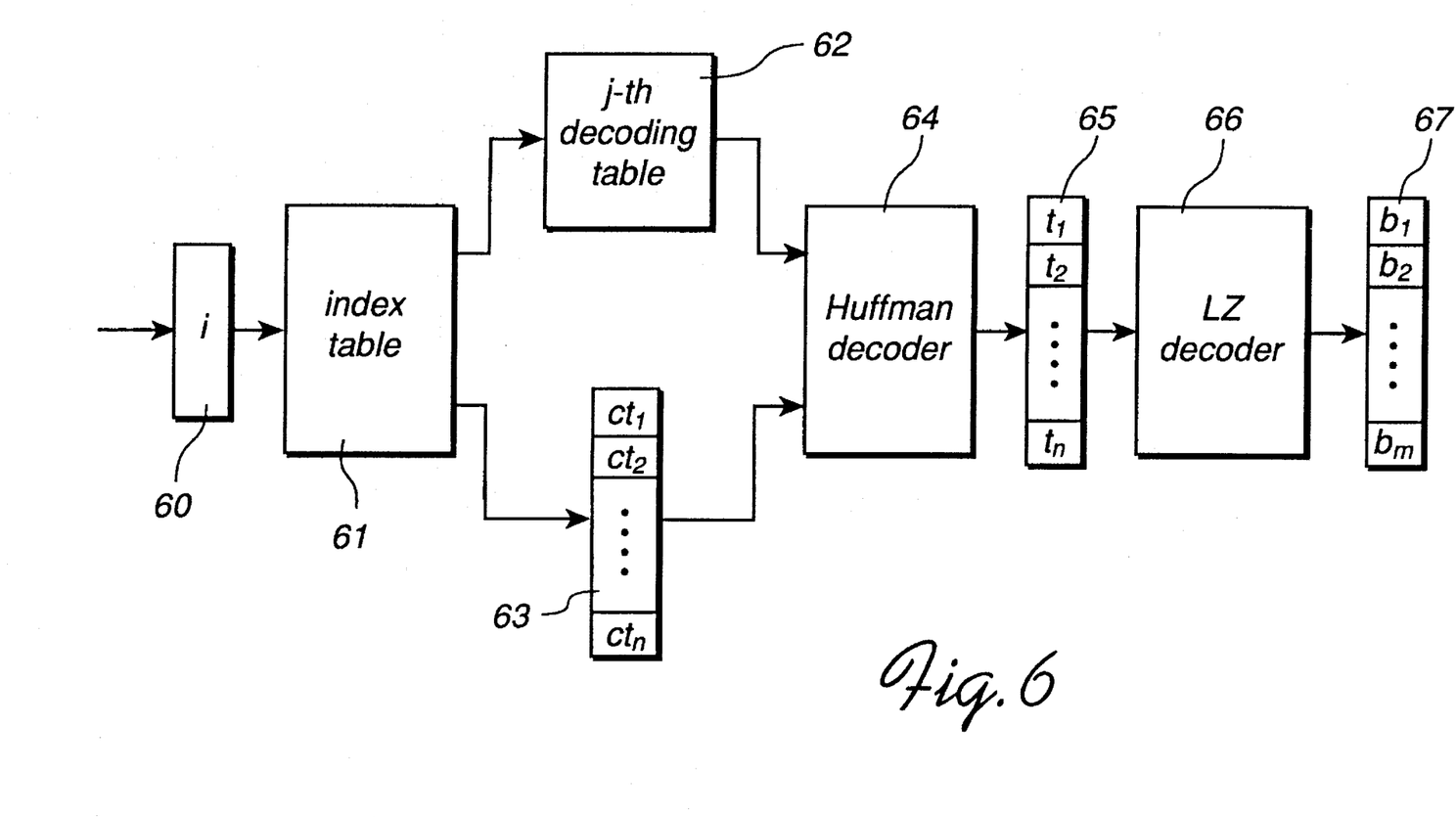
FIG. 6 is a block schematic diagram of a decoder according to the invention.

FIG. 6 is a block schematic diagram of a decoder according to the invention. In the figure, a request is processed to decode a block i 60. The index table 61 is accessed to determine which cluster the block belongs to, such that the appropriate decoding table 62 is selected. The compressed block 63 and the decoding table 62 are then decoded with a Huffman decoder 64 to produce a parsed block 65 consisting of plain tokens or events. The parsed block 65 is decoded with an LZ-type decoder 66 and a decoded block 67 is output.

Although the invention is described herein with reference to the preferred embodiment, one skilled in the art will readily appreciate that other applications may be substituted for those set forth herein without departing from the spirit and scope of the present invention. For example, the scheme disclosed herein may be used with any type of storage medium, such as ROM, disk, and optical based storage media. Additionally, such storage may be remote from point of decompression. Thus, materials compressed in accordance with the scheme herein may be decompressed after receipt over a network or as a result of a broadcast. Accordingly, the invention should only be limited by the claims included below.

We claim:

1. A method for coding a data set made up of several short blocks of data, comprising the steps of:

inputting said data set;

partitioning said data set such that each data block is assigned to a specific cluster of data blocks;

generating a set of encoding tables for each cluster that specify a translation of said data blocks into binary codes, said table generating step further comprising the steps of:

grouping said data blocks according to a selected common characteristic to produce a number of data clusters: and assigning said data blocks to said data clusters such that the sum:

$$S = S_T + S_E$$

is minimized, where $S_T$ denotes the size of the encoding tables that are stored together with the encoded data blocks, $S_E$ denotes the size of the encoded data blocks, and S denotes the total size of the compressed data set;

encoding said data blocks by applying the translation contained in said encoding tables to said data blocks;

generating an index table that references each data block to a corresponding encoding table;

translating said encoding table into a decoding table;

producing a compressed file including said index table, said decoding tables, and said encoded data blocks; and storing said file on a storage medium.

2. The method of claim 1, further comprising the step of:

locating a data block and a corresponding decoding table in said index;

randomly and independently decompressing said data blocks by applying the translation contained in said decoding table to said data block; and outputting said uncompressed data block.

3. The method of claim 1, said partitioning step further comprising the step of:

independently parsing each data block to generate a sequence of events based upon the largest possible string match in each data block.

4. The method of claim 3, said parsing step applying a Lempel-Ziv methodology.

5. The method of claim 3, said parsing step further comprising the step of:

Huffman encoding said events to assign shorter codes to more frequently occurring events and longer codes to less frequently occurring events.

6. The method of claim 1, said table generating step further comprising the steps of:

sorting said data blocks by a compressibility index obtained by compressing each block; and clustering blocks having similar compressibility indices.

7. The method of claim 1, said data set further comprising a plurality of glyphs; said table generating step further comprising the step of:

clustering said glyphs having known morphological similarities within said data set.

8. The method of claim 1, said table generating step further comprising the steps of:

dividing said data blocks into subsets; and optimizing the number of subsets thus obtained.

9. The method of claim 1, wherein the file produced by said file producing step comprises:

a compressed file structure having an index table containing one index record for each compressed data block, said index record containing any of the following:

an address of a decoding table associated with a cluster containing a data block;

an address of the beginning of a compressed data block; and a length of a compressed data block.

10. The method of claim 1 further comprising the step of:

decoding a data set made of several short blocks of data, said decoding step comprising the steps of:

locating an encoded data block and a corresponding decoding table in an index;

randomly and independently decoding said data blocks by applying a translation contained in a decoding table to said data block; and outputting said decoded data block.

11. An apparatus for coding a data set made up of several short blocks of data, comprising:

an input for receiving said data set;

means for partitioning said data set such that each data block is assigned to a specific cluster of data blocks;

means for generating a set of encoding tables for each cluster that specify a translation of said data blocks into binary codes;

means for encoding said data blocks by applying the translation contained in said encoding tables to said data blocks;

means for generating an index table that references each data block to a corresponding encoding table, said table generating means further comprising:

means for grouping said data blocks according to a selected common characteristic to produce a number of data clusters; and means for assigning said data blocks to said data clusters such that the sum:

$$S = S_T + S_E$$

is minimized, where $S_T$ denotes the size of the encoding tables that are stored together with the encoded data blocks, $S_E$ denotes the size of the encoded data blocks, and S denotes the total size of the compressed data set;

means for generating a set of decoding tables from said encoding tables;

means for producing a compressed file including said index table, said decoding tables, and said encoded data blocks; and means for storing said file on a storage medium.

12. The apparatus of claim 11, further comprising:

means for locating a data block and a corresponding decoding table in said index;

means for randomly and independently decoding said data blocks by applying the translation contained in said decoding table to said data block; and means for outputting said decoded data block.

13. The apparatus of claim 11, said partitioning means further comprising:

means for independently parsing each data block to generate a sequence of events based upon the largest possible string match in each data block.

14. The apparatus of claim 13, said parsing means applying a Lempel-Ziv methodology.

15. The apparatus of claim 13, said parsing means further comprising:

a Huffman encoder for encoding said events to assign shorter codes to more frequently occurring events and longer codes to less frequently occurring events.

16. The apparatus of claim 11, said table generating means further comprising:

means for sorting said data blocks by a compressibility index obtained by compressing each data block; and means for clustering data blocks having similar compressibility indices.

17. The apparatus for claim 11, said data set further comprising:

a plurality of glyphs;

said table generating means further comprising:

means for clustering glyphs having known morphological similarities within said data set.

18. The apparatus of claim 11, said table generating means further comprising:

means for dividing said data blocks into subsets; and means for optimizing the number of subsets thus obtained.

19. The apparatus of claim 11, wherein the file produced by said file producing means comprises:

a compressed file structure having an index table containing one index record for each compressed data block, said index record containing any of the following:

an address of a decoding table associated with a cluster containing a data block;

an address of the beginning of a compressed data block; and a length of a compressed data block.

20. The apparatus of claim 11, further comprising:

means for decoding a data set made of several short blocks of data, said decoding means comprising:

means for locating an encoded data block and a corresponding decoding table in an index;

means for randomly and independently decoding said data blocks by applying a translation contained in a decoding table to said data block; and means for outputting said decoded data block.

* * * * *